United States Patent

[11] 3,600,683

[72] Inventor David John Martin
Ilford, England

[21] Appl. No. 835,016
[22] Filed June 20, 1969
[45] Patented Aug. 17, 1971
[73] Assignee The Plessey Company Limited
Ilford, England
[32] Priority June 27, 1968
[33] Great Britain
[31] 30796/68

[54] FREQUENCY SYNTHESIZERS
3 Claims, 2 Drawing Figs.

[52] U.S. Cl. .......... 325/184, 325/187, 325/423, 331/11, 331/18
[51] Int. Cl. .......... H04b 1/04
[50] Field of Search .......... 325/184, 187, 419, 420, 417, 418, 421—423, 453; 328/155; 331/10, 11, 14, 18

[56] References Cited

UNITED STATES PATENTS

| | | | |
|---|---|---|---|
| 3,130,376 | 4/1964 | Ross .......... | 325/184 |
| 3,163,823 | 12/1964 | Kellis et al. .......... | 325/419 |

*Primary Examiner*—Robert L. Griffin
*Assistant Examiner*—Albert J. Mayer
*Attorney*—Blum, Moscovitz, Friedman & Kaplan

ABSTRACT: A frequency synthesizer comprising two control loops wherein the frequency of a slave oscillator is coarsely controlled in accordance with the setting of a variable divider contained in one loop having a short time constant and wherein fine frequency control is achieved in accordance with the setting of a further variable divider which is contained within the other loop having a long time constant (narrow bandwidth) thereby to provide the advantages of wide tuning range associated with LC oscillators with the stability of a crystal oscillator.

FREQUENCY SYNTHESIZERS

This invention relates to frequency synthesizers. Here especially but not exclusively this invention relates to synthesizers of the type comprising a main control loop, wherein a reference frequency signal is applied to a comparator for comparison with a signal frequency derived from a slave oscillator via variable divider means, such that in the presence of a frequency or phase difference between the signals applied to the comparator the slave oscillator frequency is controlled by an error signal applied from the comparator, so as to reduce the said difference, the slave oscillator frequency being selectable in accordance with the setting of the variable divider means.

According to the present invention a frequency synthesizer comprises a slave oscillator the frequency of which is controlled in dependence upon the frequency of a stable variable frequency generator and wherein fine frequency control is effected by changing the frequency of the said generator. The frequency of the said frequency generator source may be changed in accordance with the setting of a variable divider which forms part of a secondary control loop controlled by signals applied to the reference frequency source to nullify any frequency difference which may obtain between the frequency of a master oscillator and a frequency derived by the variable divider from the slave oscillator.

The frequency synthesizer may comprise a main control loop wherein a correction signal is applied to a slave oscillator in the presence of a frequency or phase difference between the output from a reference frequency source and a signal derived from an output of the slave oscillator via first variable divider means in accordance with the setting of which the slave oscillator output frequency is selectable, and a secondary control loop wherein relatively fine frequency control of the slave oscillator output frequency is effected in accordance with the setting of a second variable divider means by changing the reference frequency substantially to nullify any frequency difference between the master oscillator and a frequency derived via the second frequency divider means in dependence upon the slave oscillator frequency.

A reference frequency source may be a crystal oscillator pulled by signals developed by a comparator circuit in dependence upon a frequency or phase difference between the master oscillator and a frequency derived via the second variable frequency divider means from a signal constituting or being derived from an output signal from the slave oscillator.

An exemplary embodiment of the invention will now be described with reference to the accompanying drawings, corresponding parts of which bear the same numerical designation and in which.

Figure 1:
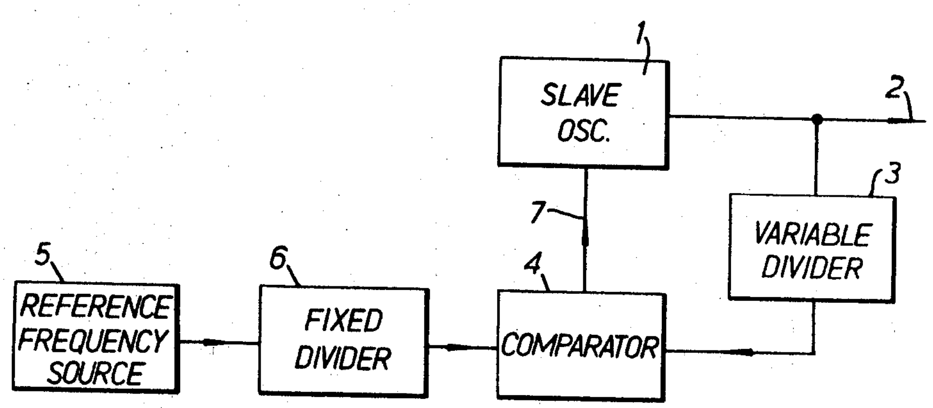
FIG. 1 is a block schematic diagram of a known synthesizer arrangement.

The known synthesizer arrangement comprises slave oscillator 1 the output frequency signal of which is supplied via line 2 and is frequency controlled in accordance with the setting of variable divider 3. The variable divider 3 is connected to receive the output frequency signal on line 2 from the slave oscillator and to supply one input to a comparator 4. Another input to the comparator 4 is derived from a reference frequency source 5 and applied to the comparator via a fixed frequency divider 6.

The operation of this basic synthesizer unit is as follows. In order that the operation of the circuit may be more easily understood an example will be considered utilizing specific frequencies. If the slave oscillator is variable over the range 40 to 70 MHz., the reference frequency source is a 5 MHz. crystal; the fixed divider divides by 500, and an output frequency of 45.45 MHz. is required it will be necessary for the variable divider 3 to divide by 45.45. Under these conditions the comparator will receive a 10 kHz. input from the fixed divider 6 and a 10 kHz. input from the variable divider 3 and no change in the control signal will be applied via line 7 to the slave oscillator 1 since the output frequency is correct. In the presence of a deviation of the output frequency from 45.45 MHz. there will obtain a difference in frequency between the input provided to the comparator by the fixed divider 6 and the input frequency applied to the comparator from the variable divider 3. An increasing phase error signal will therefore be generated and applied from the comparator over line 7 to correct the frequency of the slave oscillator such that the error signal applied over line 7 tends to the value required to produce 45.45 MHz.

One of the disadvantages of this known system is that to achieve small frequency steps the short term frequency stability must be sacrificed. This is because the frequency applied to the comparator system from the fixed divider, in the above example 10 kHz., must be equal to the smallest frequency step envisaged. For example, if it is desired to switch the variable divider as in the above example in 1 kHz. steps then the frequency applied from the fixed divider 6 to the comparator must not be larger than 1 kHz. This reference frequency applied to the comparator thus determines the time the main control loop comprised of the slave oscillator 1, the comparator 4 and the variable divider 6 takes to set up. It will be appreciated that the smaller the reference frequency applied from the divider 6 to the comparator 4 the longer will be the setting time of the loop. If the reference frequency from the fixed divider 6 is made suitably small to satisfy the requirements of say 100 Hz. steps then the setting time of the loop will be typically 1 second, which is the significant compared with the short term stability of the slave oscillator.

Figure 2:
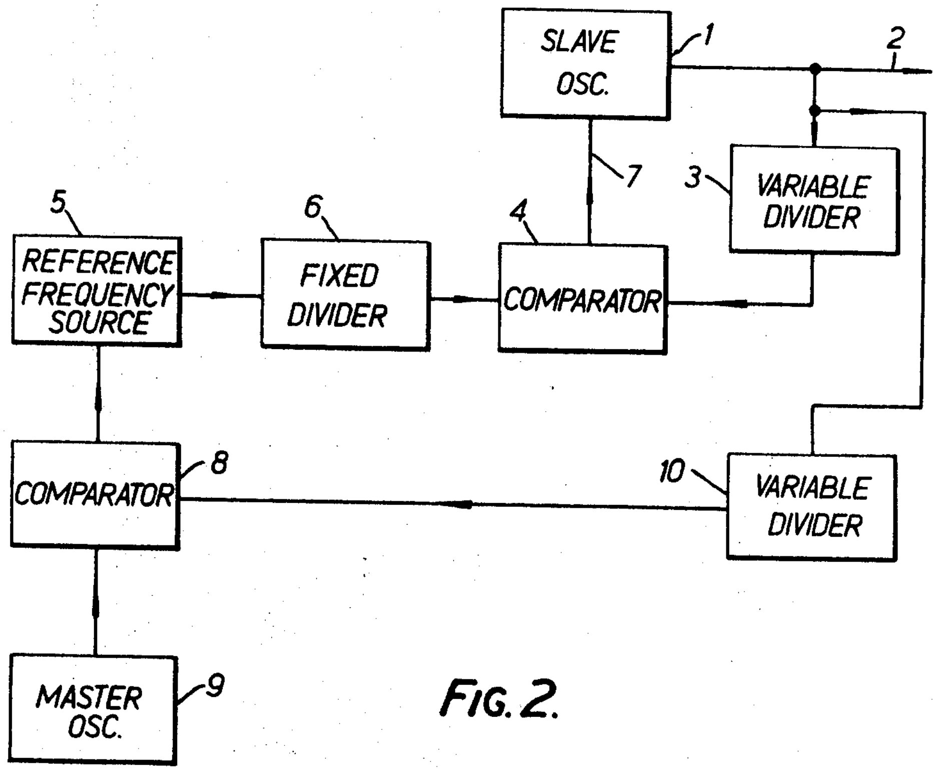
FIG. 2 is a block schematic diagram of a synthesizer arrangement according to the present invention.

Turning now to FIG. 2 a synthesizer according to one embodiment of the invention comprises the arrangement as described with reference to FIG. 1 modified by the addition of a secondary control loop having associated with it a further comparator 8, a master oscillator 9 and a variable divider 10. The variable divider 10 is fed with the output frequency from the slave oscillator 1 and provides an input to comparator 8. A further input to comparator 8 is provided from the master oscillator 9 such that in the presence of a frequency difference between the two inputs to the comparator 8 a correction signal will be fed to control the frequency of the reference frequency source 5. Conveniently, the reference source 5 takes the form of a crystal oscillator which is pulled in dependence upon the signal fed from the comparator 8. The operation of the circuit as shown in FIG. 2 will be described assuming that an output frequency of 45.4511 MHz. is required. It will be appreciated that since the arrangement of FIG. 1 only provides a 10 kHz. input from fixed divider 6 to the comparator, this frequency of 45.4511 MHz. would not be obtainable since the last two significant figures are 1 kHz. and 100 Hz. digits. It will also be appreciated that with the arrangement of FIG. 1 this frequency of 45.4511 could not be obtained by increasing the division ratio of fixed divider 6 to 50,000 such that 100 Hz. steps were made available, since this would reduce the setting frequency of the loop with a consequenting degradation of short term frequency stability.

Referring once more to FIG. 2 the frequency divider 3 is set to divide by 45.45; frequency divider 10 is set to divide by 45.4511; the reference frequency source 5, is 5 MHz.; the fixed divider 6 is set to divide by 500 and the master oscillator provides a reference frequency of 100 Hz. With the arrangement set such that the aforesaid condition obtains an output frequency of 45.4511 MHz. on line 2 will be in evidence. This is because the output frequency applied to the variable divider 10 from line 2 will produce an output from the divider of 100 cycles which is equal to the frequency of master oscillator 9 and with equal inputs of 100 cycles to comparator 8 no change in correction frequency will be applied to the reference frequency source 5 thus the output from the reference frequency source will be of the correct value (slightly higher than 5 MHz.) such as to give equal frequencies to comparator 4 when slave oscillator 1 is providing 45.4511 MHz. on line 2.

With this arrangement good short term stability is provided since the long setting up time necessary for 100 cycle steps affects only the reference frequency source 5 which in any case has good short term stability, whereas the setting time of the main control loop including the slave oscillator remains the same as in the example described with reference to FIG. 1.

It will be appreciated that various additions and modifications may be made to the arrangement as described with reference to FIG. 2 without departing from the scope of the invention. For example it will be appreciated that the fixed divider 6 is not strictly necessary and is only included to reduce the reference frequency source to the required frequency.

A reference frequency source could conceivably be provided to deliver 1 kHz. directly, and thus no fixed divider would be required.

It will also be appreciated that it may be convenient to insert a fixed divider between line 2 and the variable divider 3 and 10.

A synthesizer of the kind hereinbefore described is particularly suitable for use in radio receiving and/or transmitting equipment where it is required to accurately select a particular local oscillator or carrier frequency as the case may be.

What we claim is:

1. A frequency synthesizer comprising in a primary control loop a slave oscillator, first phase detector means, a controlled oscillator and a first variable divider, the frequency of said slave oscillator being controlled by a correction signal provided by the first phase detector means in the presence of a frequency or phase difference between a signal derived from the controlled oscillator and a signal derived from the slave oscillator via the first variable divider, the sense of the correction signal being such as to nullify the said difference, and additionally comprising in association with a secondary control loop, second phase detector means, a second variable divider and a stable master oscillator, the said second phase detector means being responsive to a frequency or phase difference between a signal derived from the master oscillator and a signal derived from the slave oscillator via the said second variable divider for providing a control signal for controlling the frequency of said controlled oscillator, in a sense such as to nullify the frequency or phase difference between the signals presented to the said second phase detector means, an output signal of said synthesizer being provided by said slave oscillator which is selectable in accordance with the setting of said variable dividers.

2. A frequency synthesizer as claimed in claim 1, comprising fixed divider means via which an output signal from said controlled oscillator is applied to the said first phase detector means.

3. A frequency synthesizer as claimed in claim 1 wherein the controlled oscillator is a crystal oscillator.